United States Patent
Jacobs et al.

(10) Patent No.: US 11,422,477 B2
(45) Date of Patent: Aug. 23, 2022

(54) VIBRATION ISOLATION SYSTEM AND LITHOGRAPHIC APPARATUS

(71) Applicant: ASML Netherlands B.V., Veldhoven (NL)

(72) Inventors: Roy Hendrikus Emilie Maria Jacobs, Eindhoven (NL); Cornelius Adrianus Lambertus De Hoon, Eindhoven (NL); Jeroen Pieter Starreveld, Knegsel (NL); Johannes Petrus Martinus Bernardus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 23 days.

(21) Appl. No.: 17/053,021

(22) PCT Filed: Apr. 23, 2019

(86) PCT No.: PCT/EP2019/060281
§ 371 (c)(1),
(2) Date: Nov. 4, 2020

(87) PCT Pub. No.: WO2019/214930
PCT Pub. Date: Nov. 14, 2019

(65) Prior Publication Data
US 2021/0080835 A1   Mar. 18, 2021

(30) Foreign Application Priority Data
May 8, 2018  (EP) ..................................... 18171249

(51) Int. Cl.
*G03F 7/20* (2006.01)
*F16F 13/00* (2006.01)
(Continued)

(52) U.S. Cl.
CPC ............ *G03F 7/709* (2013.01); *F16F 13/002* (2013.01); *F16F 15/0232* (2013.01);
(Continued)

(58) Field of Classification Search
CPC ............................... G03F 7/709; G03F 7/7085
See application file for complete search history.

(56) References Cited

U.S. PATENT DOCUMENTS 3,814,470 A   6/1974  Kicher et al.
6,020,964 A   2/2000  Loopstra et al.
(Continued)

FOREIGN PATENT DOCUMENTS

CN   103256332 A   8/2013
JP   2017-509832 A  4/2017

OTHER PUBLICATIONS

International Search Report and Written Opinion of the International Searching Authority directed to related International Patent Application No. PCT/EP2019/060281, dated Jul. 29, 2019; 11 pages.
(Continued)

*Primary Examiner* — Hung V Nguyen
(74) *Attorney, Agent, or Firm* — Sterne, Kessler, Goldstein & Fox P.L.L.C.

(57) ABSTRACT

The invention provides a vibration isolation system (IS), comprising a piston (402) to carry a payload, a connecting member (410), a spring (404) and a flexible member (408). The spring is arranged to support the piston along a direction with a positive stiffness. The flexible member is arranged to apply a force to the piston along the direction via the connecting member with a negative stiffness.

20 Claims, 6 Drawing Sheets

(51) Int. Cl.
*F16F 15/023* (2006.01)
*F16F 15/04* (2006.01)

(52) U.S. Cl.
CPC .......... *F16F 15/046* (2013.01); *G03F 7/7085* (2013.01); *F16F 2222/126* (2013.01); *F16F 2228/063* (2013.01); *F16F 2230/0005* (2013.01); *F16F 2232/08* (2013.01); *F16F 2238/022* (2013.01)

(56) References Cited

U.S. PATENT DOCUMENTS

| | | | |
|---|---|---|---|
| 6,926,263 B1 | 8/2005 | Nelson | |
| 6,952,253 B2 | 10/2005 | Lof et al. | |
| 9,869,364 B2* | 1/2018 | Evers | F16F 13/002 |
| 9,977,349 B2 | 5/2018 | Butler et al. | |
| 2007/0058173 A1 | 3/2007 | Holzapfel | |
| 2009/0033895 A1* | 2/2009 | Binnard | G03F 7/70833 |
| | | | 355/53 |
| 2014/0138887 A1* | 5/2014 | Knobloch | F16F 9/34 |
| | | | 267/126 |
| 2016/0084339 A1 | 3/2016 | Evers | |

OTHER PUBLICATIONS

International Preliminary Report on Patentability directed to related International Patent Application No. PCT/EP2019/060281, dated Nov. 10, 2020; 7 pages.

* cited by examiner

VIBRATION ISOLATION SYSTEM AND LITHOGRAPHIC APPARATUS

CROSS REFERENCE TO RELATED APPLICATIONS

This application claims priority of EP application 18171249.8 which was filed on 2018 May 8 and which is incorporated herein in its entirety by reference.

FIELD

The present invention relates to a vibration isolation system and a lithographic apparatus comprising the vibration isolation system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

To prevent vibrations to propagate to sensitive parts of the lithographic apparatus, these sensitive parts are supported by a vibration isolation system. The vibrations may originate from the surroundings of the lithographic apparatus, or may be caused by parts inside the lithographic apparatus. The sensitive parts may be optical components or measurement devices. When vibrations are able to propagate to these sensitive parts, the performance of these sensitive parts may deteriorate. For example, the vibrations may cause measurement errors by a measurement device. By supporting the sensitive parts on a vibration isolation system, the amount of vibrations reaching the sensitive parts is reduced. However, known vibration isolation systems still propagate some vibrations to the sensitive parts, which limits performance of the sensitive parts.

SUMMARY

It is an objective of the invention to provide an improved vibration isolation system.

The objective is achieved by providing a vibration isolation comprising
a piston arranged to carry a payload;
a connecting member;
a gas spring arranged to support the piston along a direction with a positive stiffness;
a flexible member arranged to apply a force to the piston along the direction via the connecting member with a negative stiffness,
wherein the flexible member comprises a leaf spring buckled in a third buckling mode.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
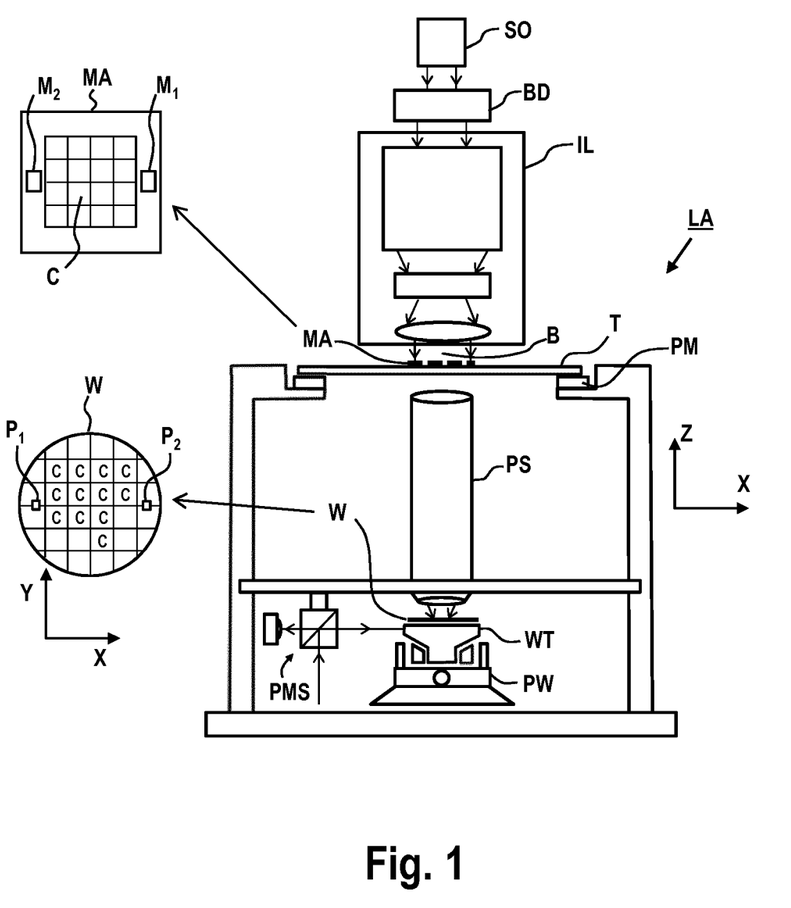
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
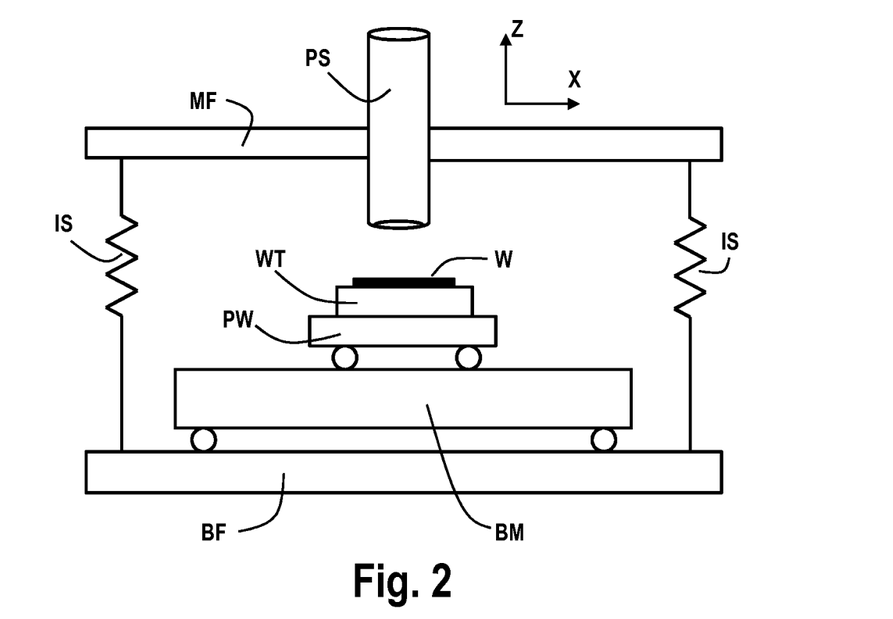
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
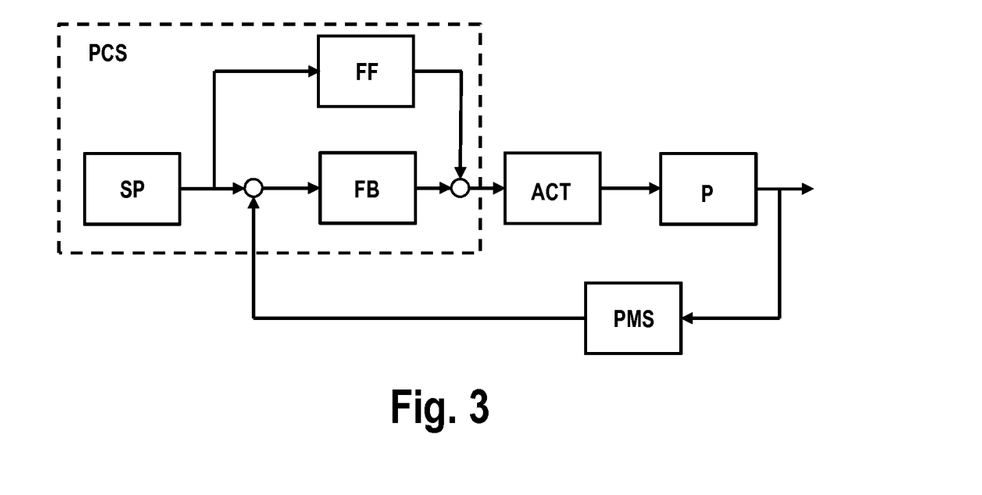
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
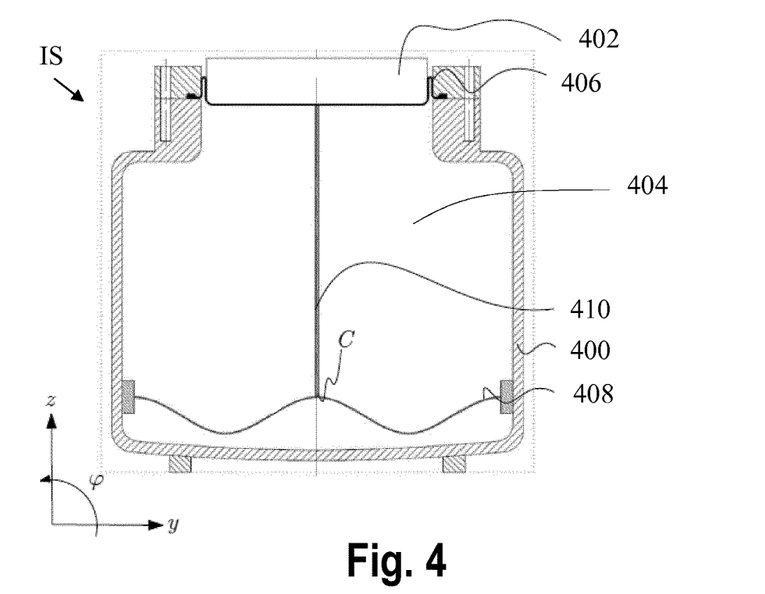
FIG. 4 depicts a vibration isolation system according to an embodiment of the invention.

FIG. 4 shows an embodiment of the vibration isolation system IS. The vibration isolation system IS comprises a pressure vessel 400 and a piston 402. The piston 402 is arranged to support a payload, such as the metrology frame and/or the projection system PS. The piston is movable in a direction, in this embodiment the z-direction. The piston 402 is movable relative to the pressure vessel 400. Movement of the piston 402 in directions other than the z-direction may be constrained. The piston 402 may be arranged to move in the horizontal plane, i.e., the xy-plane as indicated in FIG. 4.

The pressure vessel 400 creates a space 404 to maintain pressurized gas, e.g., air, to support the piston 402. The space 404 with pressurized gas forms a gas spring to support the piston 402. The gas spring has a positive stiffness, which means that if the piston 402 moves in the −z-direction, the gas spring provides a reaction force in the opposite direction, the +z-direction, to force the piston 402 towards to a nominal position in which the gas spring does not apply a force on the piston 402. If the piston 402 moves in the +z-direction, the gas spring provides a reaction force in the opposite direction, the −z-direction, to force the piston 402 back to the nominal position in which the gas spring does not apply the force on the piston 402. Due to other forces applied to the piston 402, such as the gravity force of the payload, the gas spring may not always be able to bring the piston 402 back to the nominal position. In that case, the gas spring keeps maintaining the reaction force on the piston 402. The gas spring creates the reaction force by providing contact between the pressurized gas and a surface area of the piston 402.

Ideally, the positive stiffness is a small as possible. With a small positive stiffness, the amount of vibrations propagating along the vibration isolation system IS is reduced. However, there are physical limitations to how small the positive stiffness may be. For example, the pressure in the space 404 needs to be sufficient to carry the weight of the payload. Due to volume limitations of the space 404 and piston 402, the pressure has a minimum value, causing a minimum value of the gas spring stiffness. Further, a rolling diaphragm 406, or any other flexible element, may be used to separate the space 404 with pressurized gas form the surroundings. The rolling diaphragm 406 may be connected to the piston 402. Even though the rolling diaphragm 406 is made flexible, the rolling diaphragm 406 adds some positive stiffness. Flexible elements such as wires and hoses connected to the payload may create a positive stiffness acting on the piston 402.

To reduce the positive stiffness, the embodiment of FIG. 4 is provided with a flexible member 408 and a connecting member 410. The flexible member 408 is arranged to apply a force along the z-direction to the piston 402 via the connecting member 410 with a negative stiffness.

Figure 5:
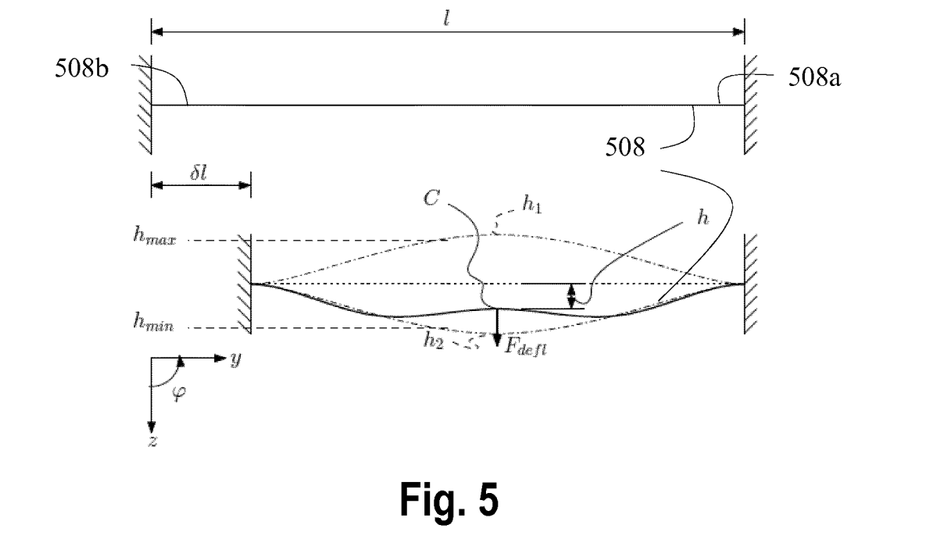
FIG. 5 depicts a leaf spring for use in the vibration isolation system.

In this embodiment, the flexible member 408 comprises a leaf spring 508 (as shown in FIG. 5) having a main surface that is perpendicular to the z-direction. The main surface is in the xy-plane. The neutral line of the leaf spring 508 is perpendicular to the z-direction. The leaf spring 508 is arranged to be buckled in a third buckling mode. The connecting member 410 is connected to the leaf spring 508 in a center part of the leaf spring 508.

FIG. 5 schematically shows the leaf spring 508. The length of the leaf spring 508 in the y-direction is length 1. In the top part of FIG. 5, it is shown that the ends 508a, 508b of the leaf spring 508 are constrained by the fixed world such that the ends cannot rotate relative to the fixed world. Also, the ends 508a, 508b of the leaf spring 508 are constrained by the fixed world such that the ends 508a, 508b cannot translate in x, y, and/or z-direction. The ends 508a, 508b extend perpendicular from the fixed world. The distance between the both ends 508a, 508b along the y-direction is the same as length 1, so the leaf spring 508 is not compressed in the y-direction.

In the bottom part of FIG. 5, the distance is reduced with δ1. As a result, the leaf spring 508 is compressed over a distance δ1, resulting in the first buckling mode in which a center part C of the leaf spring 508 is deflected to either position h1 or h2, as indicated with the dash-and-dot-line. Displacing the center part C from h1 towards h2 (or vice versa) causes the leaf spring 508 to be transitioned in a higher order buckling mode. The leaf spring 508 can be brought in the third buckling mode as shown with the solid line. The third buckling mode is depicted in FIG. 4, in which the ends 508a, 508b of the leaf spring 508 are constrained by the pressure vessel 400 such that the ends 508a, 508b cannot rotate and translate relative to the pressure vessel 400.

Buckling the leaf spring 508 in the third buckling mode has the effect that displacing the center part C, causes center part C to move with a negative stiffness. The connecting member 410 is connected to the center C. When the piston 402 is displaced, the connecting member 410 displaces the center part C. Because center C is moved with a negative stiffness, the flexible member 408 provides a force to the piston 402 via the connecting member 410. The force is directed along the z-direction away from a nominal position in which the force created by the flexible member 408 is zero. This can be explained via FIG. 5. Center part C is in the nominal position when center part C is on the neutral line. When center C is displaced towards h2, i.e., in the +z direction, the leaf spring 508 creates a force $F_{defl}$ that pushes center part C towards h2. In comparison, a positive stiffness would cause a force towards the nominal position, i.e., the neutral line, instead of away from the nominal position.

As a result, when the piston 402 is displaced, the piston 402 experiences a force created by the positive stiffness of the gas spring and the rolling diaphragm 406, and the force $F_{defl}$ created by the flexible member 408. By selecting parameters for properties of the flexible member 408, such as length l, thickness, width, type of material, a negative stiffness is created that matches with the positive stiffness. In an embodiment, the negative stiffness may exactly match the positive stiffness. This would give the best vibration isolation. However, due to manufacturing tolerances and controller robustness, it may be beneficial to make the negative stiffness a little smaller than the positive stiffness. So in practice it may be beneficial to have an equivalent stiffness that is positive. The equivalent stiffness is a sum of the positive stiffness and the negative stiffness.

In the embodiment of FIG. 4, the flexible member 408 is buckled in the third buckling mode. Instead, the flexible member 408 may be buckled in any of the second buckling mode or higher buckling modes. The benefit of using the third buckling mode, is that there is no torsion applied the center part C. As a result, the connecting member 410 does not have to cancel any torsion. When for example the second buckling mode is used, the center part C creates a torsion on the connecting member 410. This torsion may be cancelled by arranging the connecting member 410 to have torsion stiffness, for example by implementing the connecting member 410 as a beam with sufficient cross-section. To absorb the torsion, the piston 402 may be rotationally constrained by a gas bearing.

It may be beneficial to apply only tensile stress to the connecting member 410 during operational use of the vibration isolation system IS. Having only tensile stress, and thus no compression stress, reduces the chance of buckling of the connecting member 410. As a result, the connecting member 410 may have a slender shape, such as a strut. To have tensile stress, the following arrangement may be applied. The piston 402, the nominal position and the center part C are arranged along the z-direction, wherein the nominal position is maintained in between the piston 402 and the center part during operational use of the vibration isolation system. As a result, during operational use, the force $F_{defl}$ will be directed away from the nominal position and thus away from the piston 402. The force $F_{defl}$ will create a tensile force on the connecting member 410 during operational use. Note that the reaction force to force $F_{defl}$ is applied to the gas spring, which is compressed as a result. Typically, the force $F_{defl}$ is much smaller, for example 10 times smaller, than the gravity load of the payload.

In the examples above, a leaf spring 508 is discussed. In an embodiment, any other type of mechanical spring may be used. For example a coil spring or multiple coil springs.

The connecting member 410 may be substantially rigid in the z-direction and flexible in another direction than the z-direction. The connecting member 410 is arranged to provide the force $F_{defl}$ along the z-direction. There may be a component of force $F_{defl}$ that is in a different direction than the z-direction. If this component of force $F_{defl}$ would be applied to the piston 402, the piston 402 would experience undesired displacement or deformation. By making the connecting member 410 rigid in the z-direction, the force $F_{defl}$ can be transferred to the piston 402 effectively. By making the connecting member 410 flexible in one or more other directions, disturbance forces on the piston 402 are prevented or reduced. The connecting member 410 may be implemented as a strut. A strut is a body wherein the length of the body is many times longer than its width and depth. For example, the length is 10 or 20 or 30 times longer than its width and depth. The cross-section of the strut may be circular or square. The strut may be hollow. The strut may have a cross-section in the middle part of the strut that is larger than the cross-section near the end parts of the strut to prevent buckling of the strut. The connecting member 410 may have elastic hinges to provide the desired flexibility.

Figure 6:
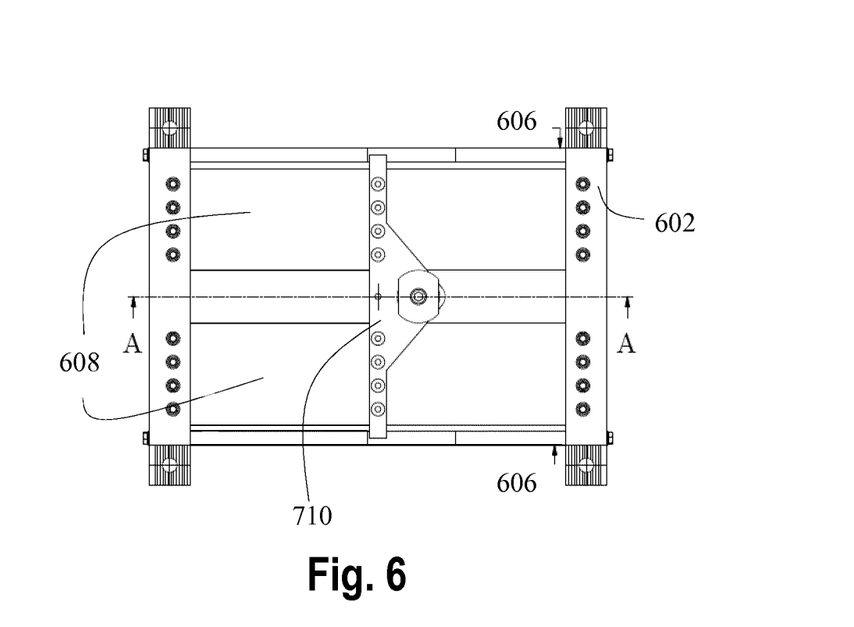
FIG. 6 depicts a top-view of a part of the vibration isolation system according to another embodiment of the invention.
Figure 7:
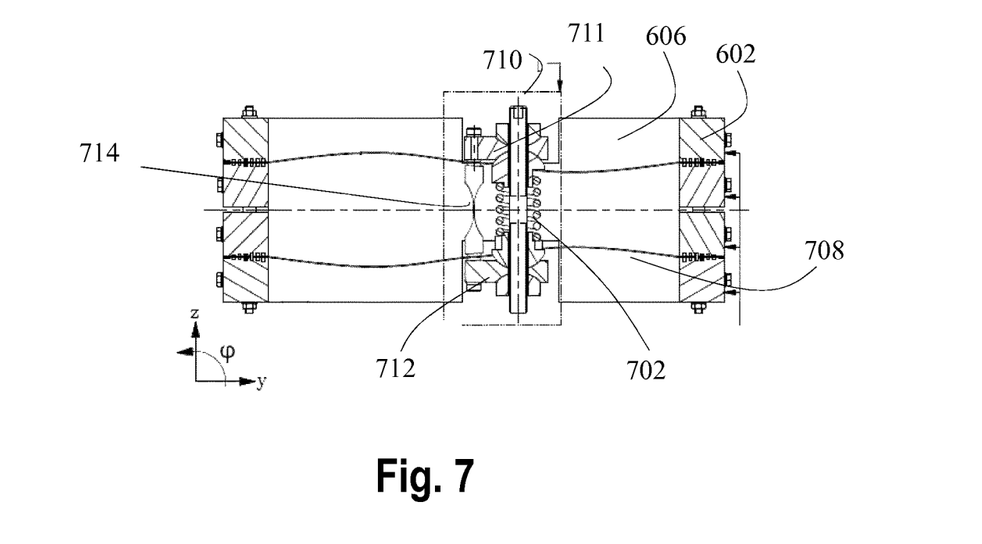
FIG. 7 depicts a sectional view of the part of FIG. 6.

FIGS. 6 and 7 show respectively a top-view and a sectional view of an embodiment of the vibration isolation system. FIG. 6 shows two leaf springs 608 next to each other with an offset in between the two leaf springs. These two leave springs are referred to as 'upper leafsprings 608'. Two ends of each upper leaf spring are clamped to a force frame 602 in a similar way as in FIG. 4. The ends of the upper leaf springs 608 are constrained by the force frame 602 such that the ends cannot rotate or translate relative to the force frame 602. The force frame 602 is mounted inside the space 404 with pressurized gas. FIG. 7 shows that further leaf springs are arranged parallel to the upper leaf springs 608. These further leaf springs are referred to as 'lower leaf springs 708'. Note that only one lower leaf spring is visible in FIG. 7. The other lower leaf spring is behind the visible lower leaf spring. There is an offset along the z-direction between the upper leaf springs 608 and the lower leaf springs 708. In case the z-direction is vertical, the upper leaf springs 608 are above the lower leaf springs 708. There is provided a second connecting member 710. The second connecting member 710 connects the center part formed by the upper leaf springs 608 with the center part formed by the lower leaf springs 708. The center part formed by the upper leaf springs 608 and the center part formed by the lower leaf springs 708 are aligned with the center of the piston 402 along the z-direction.

The second connecting member 710 has a first part 711, a second part 712 and a hinge 714. The first part 711 is connected to the upper leaf springs 608. The second part 712 is connected to the lower leaf springs 708. The first part 711 and the second part 712 are rotatably connected to each other via the hinge 714. The hinge 714, which may be an elastic hinge, is arranged to rotate the first part 711 and the second part 712 relative to each other along an axis perpendicular to the z-direction, in this case the x-direction. The hinge 714 may be arranged to constrain the first part 711 and the second part 712 relative to each other in other degrees of freedom than the rotation along the axis perpendicular to the z-direction.

The second connecting member 710 may comprise an adjustment device 702 arranged to adjust the rotation of the first part 711 relative to the second part 712. By adjusting the rotation of the first part 711 relative to the second part 712, the adjustment device 702 can adjust a rotation of the center part of the upper leaf springs 608 and the center part of the lower leaf springs 708 relative to each other along the axis perpendicular to the z-direction. By adjusting the rotation of the center part of the upper leaf springs 608 and the center part of the lower leaf springs 708, the negative stiffness of the upper leaf springs 608 and the center of the lower leaf springs 708 can be adjusted. By adjusting the negative stiffness, a desired negative stiffness can be applied, improving the performance of the vibration isolation system.

The adjustment device 702 may comprise a differential set screw. By rotating the differential set screw, the distance between the first part 711 and the second part 712 can be altered. The differential set screw is at an offset of the hinge 714 along the y-direction, so when the differential set screw alters the distance between the first part 711 and the second part 712, the first part 711 and the second part 712 are rotated relative to each other via the hinge 714. A spring may be applied between the first part and the second part 712 to preload the set screw to reduce any play of the differential set screw. The differential set screw may be rotated manually or via an actuator. Instead of a differential set screw any other suitable adjustment arrangement may be used, for example, an linear actuator, a pneumatic actuator, a piezo actuator or a Lorenz actuator.

Instead of two upper leaf springs 608, a single upper leaf spring may be used. The single upper leaf spring may have a hole for receiving the second connecting member 710. Similarly, instead of two lower leaf springs 708, a single lower leaf spring may be used. The single lower leaf spring may have a hole for receiving the second connecting member 710. In an embodiment, more than two upper leaf springs 608 and/or more than two lower leaf springs 708 may be used.

Figure 8:
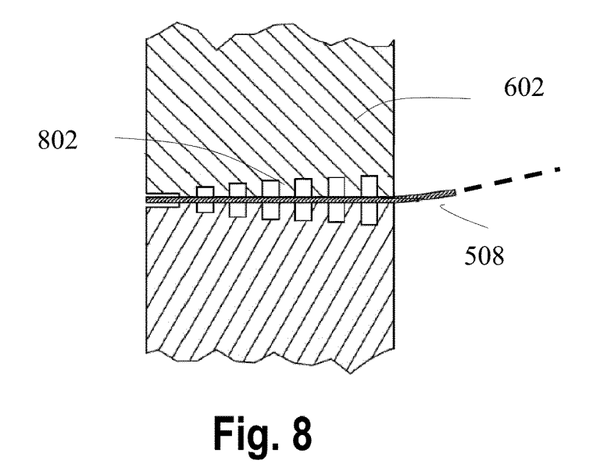
FIG. 8 depicts a detailed view of part of the vibration isolation system according to yet another embodiment of the invention.

FIG. 8 shows a detailed view of the force frame 602 and part of the leaf spring 508. The force frame 602 supports the leaf spring 508. The force frame 602 comprises a plurality of clamping members 802. In FIG. 8, seven clamping members 802 are shown on opposite sides of the leaf spring 508. By preloading the clamping members 802 with the leaf spring 508 in between, the preload and friction between the leaf spring 508 and the clamping members 802 clamp the leaf spring 508 to the force frame 602. This way, the leaf spring 508 is prevented from slipping from the force frame 602. Note that the right part of the leaf spring 508 is the part that extends toward the connecting member 410, as indicated by the dashed line.

Depending on the movement of the piston 402, the shape of the leaf spring 508 will change. To minimize hysteresis, micro slip between the leaf spring 508 and the clamping members 802 should be minimized when the shape of the leaf spring 508 changes. The part of the leaf spring 508 held by the clamping member on the right side of FIG. 8, i.e., the clamping member the closest to the center part of the leaf spring 508, will change shape more than the part of the leaf spring 508 held by the other clamping members 802. Due to the friction force at each clamping member, the change in shape of the leaf spring 508 becomes less for each clamping member further away from the center part of the leaf spring 508.

To minimize hysteresis, the clamping member closer to the center part of the leaf spring 508 is more flexible than a clamping member further from the center part of the leaf spring 508. This way, the clamping force is more evenly divided over the clamping members 802. The length of the clamping members 802 differ. The longer the length, the more flexible the clamping member is.

To improve the dynamics of the leaf spring 508, a damping material may be provided on the leaf spring 508. The damping material may be a rubber like material, a visco-elastic material or any other suitable type of damping material. A constraining layer may be applied over the damping material, such that the damping material is in between the leaf spring 508 and the constraining layer. To improve the dynamics of the connecting member 410, a tuned mass damper may be applied to damp a dominant resonance mode of the connecting member 410.

Figure 9:
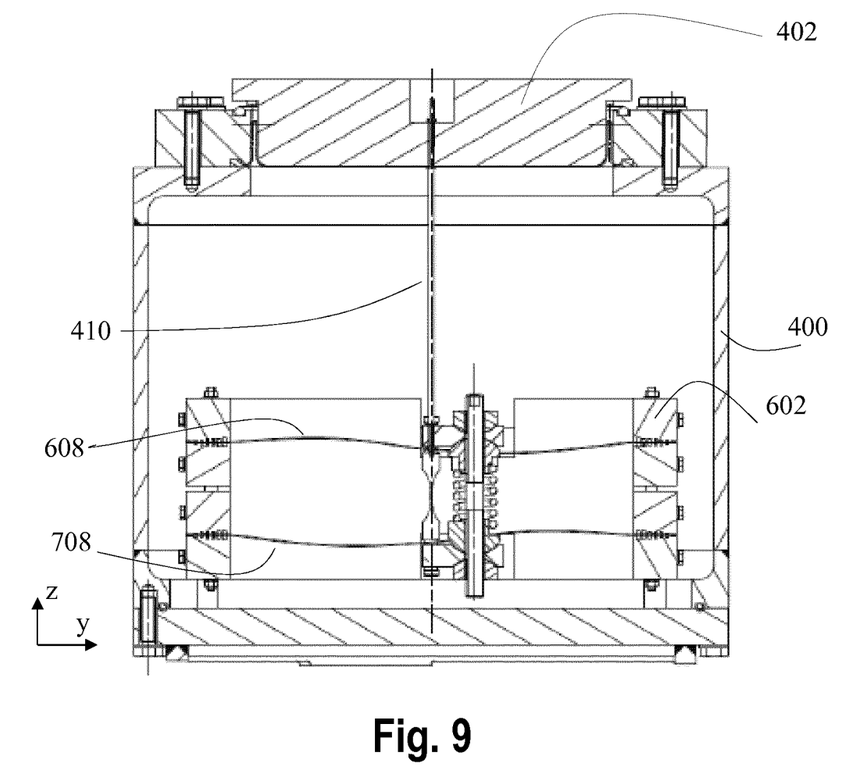
FIG. 9 depicts a vibration isolation system according to another embodiment of the invention.

FIG. 9 shows an embodiment of the vibration isolation system, wherein the force frame 602 is arranged inside the space 404 with pressurized gas. The force frame 602 is arranged inside pressure vessel 400. Because the leaf springs are compressed into a buckling mode, the leaf springs apply a force to the force frame 602 along the y-direction. This force can be countered by mounting the force frame 602 to the pressure vessel 400. However, this would cause deformation of the pressure vessel 400. Alternatively, the force frame 602 may be provided with two plates 606 extending along the y-direction. The two plates 606 are arranged on opposite sides of the force frame 602, as seen along the x-direction. In addition or alternative, the two plates 606 are arranged at the top side and the bottom side of the force frame 602. The plate at the top side may have openings to receive the connecting member 410. The plates 606 prevent the leaf springs from moving the force frame 602 outwards along the y-direction. The plates 606 are used to set the distance reduction δ1 to bring the leaf springs in the desired buckling mode.

The pressure vessel 400 may be square shaped, circular shaped or rectangular shaped. The pressure vessel 400 may be mounted on the base frame BM.

Figure 10:
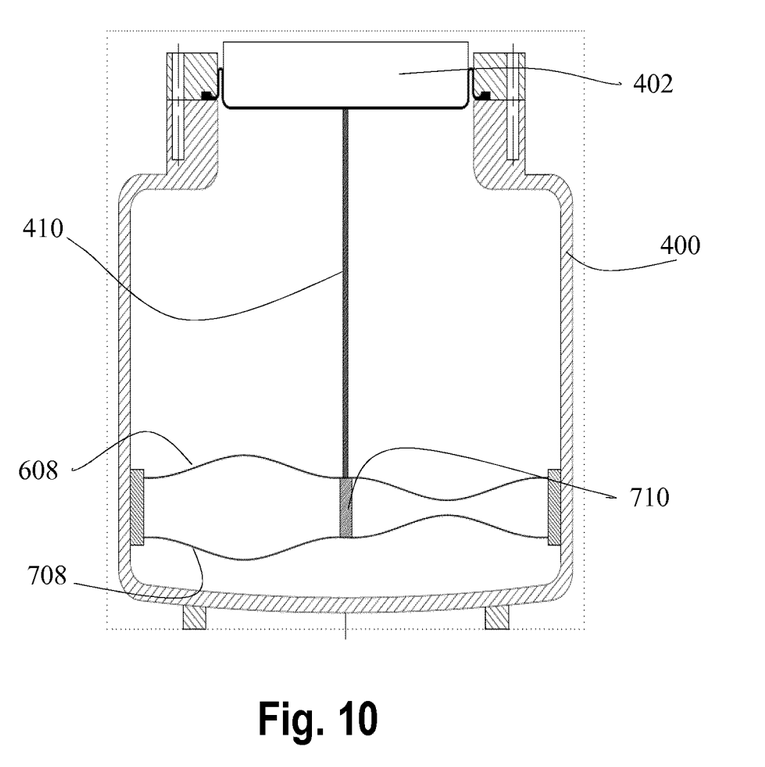
FIG. 10 depicts a vibration isolation system according to a further embodiment of the invention.

FIG. 10 depicts another embodiment according to the invention. FIG. 10 shows the upper leaf springs 608 and the lower leaf springs 708. The upper leaf springs 608 and the lower leaf springs 708 are connected via the second connecting member 710. The second connecting member 710 connects the center part of the upper leaf springs 608 and the center part of the lower leaf springs 708. The upper leaf springs 608 are buckled in a buckling mode, in this case the third buckling mode. The lower leaf springs 708 are buckled in the same buckling mode as the upper leaf springs 608, so also in the third buckling mode. However, the buckling of the upper leaf springs 608 and the lower leaf springs 708 is mirrored relative to each other. This has the benefit that any torsion on the center part of the upper leaf spring is cancelled out by the same, but opposite torsion on the center part of the lower leaf spring and vice versa.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A vibration isolation system, comprising
   a piston arranged to carry a payload;
   a connecting member;
   a gas spring arranged to support the piston along a direction with a positive stiffness; and
   a flexible member arranged to apply a force to the piston along the direction via the connecting member with a negative stiffness,
   wherein the flexible member comprises a leaf spring buckled in a third buckling mode.

2. The vibration isolation system of claim 1, wherein the connecting member is connected to the leaf spring in a center part of the leaf spring.

3. The vibration isolation system of claim 2, further comprising:
   a force frame arranged to support the leaf spring,
   wherein the force frame comprises a plurality of clamping members, and
   wherein a clamping member closer to the center part of the leaf spring is more flexible than a clamping member farther from the center part of the leaf spring.

4. The vibration isolation system of claim 1, wherein the leaf spring has a main surface perpendicular to the direction.

5. The vibration isolation system of claim 1, wherein the force is directed along the direction away from a nominal position in which the force is zero.

6. The vibration isolation system of claim 5, wherein the leaf spring is compressed in the nominal position.

7. The vibration isolation system of claim 5, wherein:
the piston, the nominal position and the center part are arranged along the direction, and
the nominal position is maintained in between the piston and the center part during operational use of the vibration isolation system.

8. The vibration isolation system of claim 7, wherein the connecting member is a strut.

9. The vibration isolation system of claim 1, wherein the connecting member is provided with elastic hinges.

10. The vibration isolation system of claim 1, further comprising a damping material provided on the leaf spring.

11. The vibration isolation system of claim 1, further comprising:
a second leaf spring, and a second connecting member,
wherein the second leaf spring is arranged parallel to the leaf spring at an offset along the direction, and
wherein the second connecting member connects the center part of the leaf spring with a center part of the second leaf spring.

12. The vibration isolation system of claim 11, wherein the leaf spring and the second leaf spring are buckled in a same buckling mode mirrored relative to each other.

13. The vibration isolation system of claim 11, wherein the second connecting member comprises an adjustment device arranged to adjust a rotation of at least one of the center part of the leaf spring and the center part of the second leaf spring,
wherein the rotation is along an axis perpendicular to the direction, wherein the adjustment device comprises a first part, a second part, a hinge and an adjustment arrangement,
wherein the first part is connected to the center part of the leaf spring,
wherein the second part is connected to the center part of the second leaf spring,
wherein the first part and the second part are rotatably connected to each other via the hinge, and
wherein the adjustment arrangement is arranged to set the rotation.

14. The vibration isolation system of claim 1, wherein the connecting member is substantially rigid in the direction and is flexible in another direction other than the direction.

15. A lithographic apparatus, comprising:
a mask support to support a patterning device having a pattern;
a substrate support to support a substrate;
a projection system arranged to project the pattern on the substrate;
a metrology frame arranged to support at least part of a position measurement system arranged to determine a position of one of the mask support and the substrate support; and
a vibration isolation system comprising:
a piston arranged to carry a payload;
a connecting member;
a gas spring arranged to support the piston along a direction with a positive stiffness; and
a flexible member arranged to apply a force to the piston along the direction via the connecting member with a negative stiffness,
wherein the flexible member comprises a leaf spring buckled in a third buckling mode, and
wherein the payload comprises at least one of the projection system and the metrology frame.

16. The lithographic apparatus of claim 15, wherein the connecting member is connected to the leaf spring in a center part of the leaf spring.

17. The lithographic apparatus of claim 16, comprising a force frame arranged to support the leaf spring, wherein the force frame comprises a plurality of clamping members, and wherein a clamping member closer to the center part of the leaf spring is more flexible than a clamping member farther from the center part of the leaf spring.

18. The lithographic apparatus of claim 15, wherein the connecting member is provided with elastic hinges.

19. The lithographic apparatus of claim 15, further comprising a damping material provided on the leaf spring.

20. The lithographic apparatus of claim 15, further comprising:
a second leaf spring, and a second connecting member,
wherein the second leaf spring is arranged parallel to the leaf spring at an offset along the direction, and
wherein the second connecting member connects the center part of the leaf spring with a center part of the second leaf spring.

* * * * *

UNITED STATES PATENT AND TRADEMARK OFFICE
CERTIFICATE OF CORRECTION

PATENT NO. : 11,422,477 B2
APPLICATION NO. : 17/053021
DATED : August 23, 2022
INVENTOR(S) : Jacobs et al.

Page 1 of 1

It is certified that error appears in the above-identified patent and that said Letters Patent is hereby corrected as shown below:

In the Claims

In Column 12, Line 40, replace "comprising" with --comprising:--.

Signed and Sealed this
Twenty-seventh Day of September, 2022

Katherine Kelly Vidal
*Director of the United States Patent and Trademark Office*